(12) United States Patent
Hwang et al.

(10) Patent No.: US 7,965,033 B2
(45) Date of Patent: Jun. 21, 2011

(54) ORGANIC LIGHT EMITTING DIODE DISPLAY

(75) Inventors: Young-In Hwang, Daegu-si (KR); Baek-Woon Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 233 days.

(21) Appl. No.: 12/243,286

(22) Filed: Oct. 1, 2008

(65) Prior Publication Data

US 2009/0085477 A1    Apr. 2, 2009

(30) Foreign Application Priority Data

Oct. 2, 2007    (KR) .................. 10-2007-0099215

(51) Int. Cl.
*H01J 1/62*    (2006.01)
(52) U.S. Cl. ........................................................ 313/504
(58) Field of Classification Search .......... 313/500–506, 313/110–113
See application file for complete search history.

(56) References Cited

U.S. PATENT DOCUMENTS

| | | | | |
|---|---|---|---|---|
| 6,639,250 | B1 * | 10/2003 | Shimoda et al. | 257/98 |
| 7,045,949 | B2 * | 5/2006 | Yamada et al. | 313/504 |
| 2005/0269947 | A1 * | 12/2005 | Kobayashi | 313/504 |
| 2009/0200544 | A1 * | 8/2009 | Lee et al. | 257/40 |

* cited by examiner

*Primary Examiner* — Joseph L Williams
*Assistant Examiner* — Brenitra M Lee
(74) *Attorney, Agent, or Firm* — H.C. Park & Associates, PLC

(57) ABSTRACT

An organic light emitting device includes a first pixel, a second pixel, and a third pixel to display different colors from each other, wherein the organic light emitting device includes a first electrode, a second electrode facing the first electrode, a light emitting member disposed between the first electrode and the second electrode, and a translucent member disposed on or under the first electrode and forming a micro-cavity along with the second electrode. The translucent member has the same thickness in the first pixel as in the second pixel.

15 Claims, 13 Drawing Sheets

FIG.2

| G | B | R | G | B |
|---|---|---|---|---|
| B | R | G | B | R |
| R | G | B | R | G |
| G | B | R | G | B |
| B | R | G | B | R |

ORGANIC LIGHT EMITTING DIODE DISPLAY

CROSS-REFERENCE TO RELATED APPLICATION

This application claims priority from and the benefit of Korean Patent Application No. 10-2007-0099215, filed on Oct. 2, 2007, which is hereby incorporated herein by reference for all purposes as if fully set forth herein.

BACKGROUND OF THE INVENTION

1. Field of the Invention

The present invention relates to an organic light emitting device.

2. Discussion of the Background

Recent trends toward lightweight and thin personal computers and television sets have created a need for lightweight and thin display devices, and flat panel displays, such as liquid crystal displays (LCDs), that satisfy such requirements are being substituted for conventional cathode ray tubes (CRTs).

However, because the LCD is a passive display device, a back-light as a light source is needed, and the LCD may have various problems, such as a slow response time and a narrow viewing angle.

Among flat panel displays, an organic light emitting device may be the most promising as a display device for solving these problems.

The organic light emitting device includes two electrodes and an organic light emitting layer interposed between the two electrodes. One of the two electrodes injects holes and the other injects electrons into the light emitting layer. The injected electrons and holes are combined to form excitons, and the excitons emit light as they discharge energy.

Because the organic light emitting device is a self-emissive display device, an additional light source is not necessary. Therefore, the organic light emitting device may have low power consumption, as well as a high response speed, a wide viewing angle, and a high contrast ratio.

On the other hand, the organic light emitting device includes a plurality of pixels, such as red pixels, blue pixels, and green pixels, and images of full colors may be displayed by selectively combining these pixels.

However, the organic light emitting device has different light emitting efficiency according to light emitting materials. That is, a material having low light emitting efficiency among red, green, and blue may not be able to represent a desired color coordinate, and it may also be difficult to display a desired white color because white color is emitted by combining red, green, and blue.

To improve the light emitting efficiency, a micro-cavity may be used.

In a micro-cavity, light is repeatedly reflected between a reflection layer and a translucent layer that are spaced apart such that a strong interference effect is generated in the light. Accordingly, light of a specific wavelength is constructive, and light of the remaining wavelengths is destructive.

As such, the luminance and the color reproducibility may be simultaneously improved at the front side of the display panel.

However, when there is a micro-cavity, a color shift, in which a color viewed from the front side of the display panel is different from the color viewed from the lateral side of the display panel, is generated, and the color reproducibility may be reduced.

SUMMARY OF THE INVENTION

The present invention provides an organic light emitting device, which may have improved color characteristics including increased color reproducibility and reduced color shift.

Additional features of the invention will be set forth in the description which follow, and in part will be set forth in the description which follows, and in part will be apparent from the description, or may be learned by practice of the invention.

The present invention discloses an organic light emitting device including a first pixel, a second pixel, and a third pixel to display different colors from each other, wherein the organic light emitting device includes a first electrode, a second electrode facing the first electrode, a light emitting member disposed between the first electrode and the second electrode, and a translucent member disposed on or under the first electrode. The translucent member and the second electrode form a microcavity, and the translucent member has substantially the same thickness in the first pixel as in the second pixel.

The present invention also discloses an organic light emitting device including a red pixel, a green pixel, a blue pixel, wherein the organic light emitting device includes a first electrode, a light emitting member to emit white light disposed on the first electrode, a second electrode disposed on the light emitting member, a color filter disposed on or under the first electrode, and a translucent member including a first layer and a second layer that are alternately disposed and have different refractive indexes. The translucent member is disposed between the light emitting member and the color filter, and the translucent member is not disposed in the green pixel.

The present invention also discloses an organic light emitting device including a first pixel, a second pixel, and a third pixel to display different colors from each other, wherein the organic light emitting device includes a first electrode and a second electrode facing each other, a light emitting member to emit white light disposed between the first electrode and the second electrode, a color filter disposed on or under the light emitting member, and a translucent member disposed between the light emitting member and the color filter. The white light changes when reflected between the second electrode and the translucent member in the first pixel and the second pixel, and the changed light is transmitted through the color filter to display a first color and a second color, and the white light is transmitted through the color filter to display a third color in the third pixel without transmitting the translucent member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 2 is a schematic diagram showing an arrangement of a plurality of pixels in the organic light emitting device according to an exemplary embodiment of the present invention.

DETAILED DESCRIPTION OF THE ILLUSTRATED EMBODIMENTS

Figure 1:
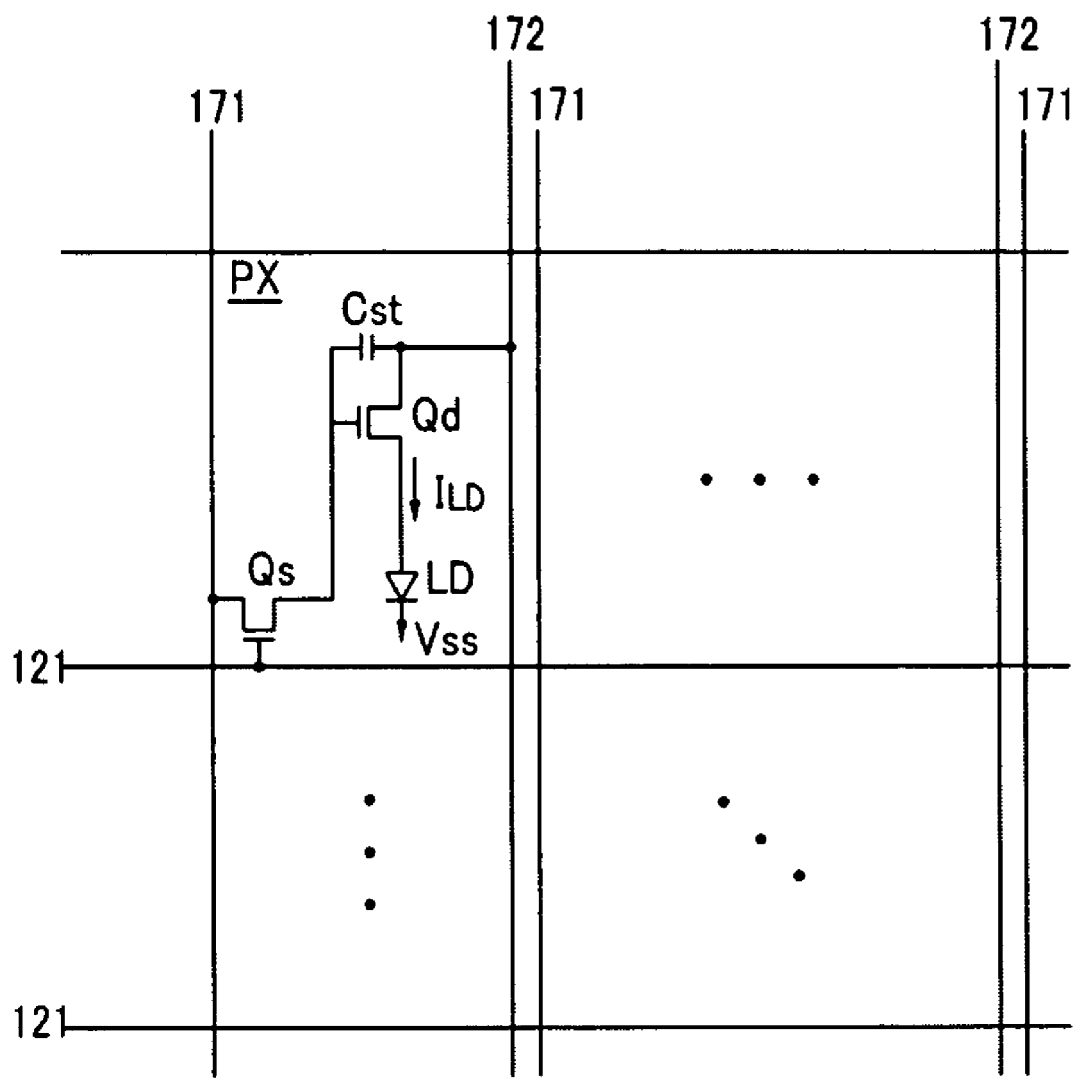
FIG. 1 shows an equivalent circuit diagram of an organic light emitting device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layer and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Now, an OLED according to an exemplary embodiment of the present invention will be described in detail with reference to FIG. 1.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 to transmit gate signals (or scanning signals), a plurality of data lines 171 to transmit data signals, and a plurality of driving voltage lines 172 to transmit a driving voltage. The gate lines 121 extend substantially in a row direction and are substantially parallel to each other, and the data lines 171 and the driving voltage lines 172 extend substantially in a column direction and are substantially parallel to each other.

Each pixel PX includes a switching transistor Qs, a driving transistor Qd, a capacitor Cst, and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting diode LD. The driving transistor Qd drives an output current $I_{LD}$ having a magnitude depending on the voltage between the control terminal and the input terminal thereof, and outputs it to the organic light emitting diode LD.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting diode LD includes an anode connected to the output terminal of the driving transistor Qd and a cathode connected to a common voltage Vss. The organic light emitting diode LD emits light having an intensity depending on the output current $I_{LD}$ of the driving transistor Qd, thereby displaying images.

The switching transistor Qs and the driving transistor Qd may be n-channel field effect transistors (FETs). Alternatively, at least one of the switching transistor Qs and the driving transistor Qd may be a p-channel FET. In addition, the connections among the transistors Qs and Qd, the capacitor Cst, and the organic light emitting diode LD may be modified.

The structure of the organic light emitting device will be described in detail below with reference to FIG. 2, FIG. 3, FIG. 4, and FIG. 5.

Figure 2:
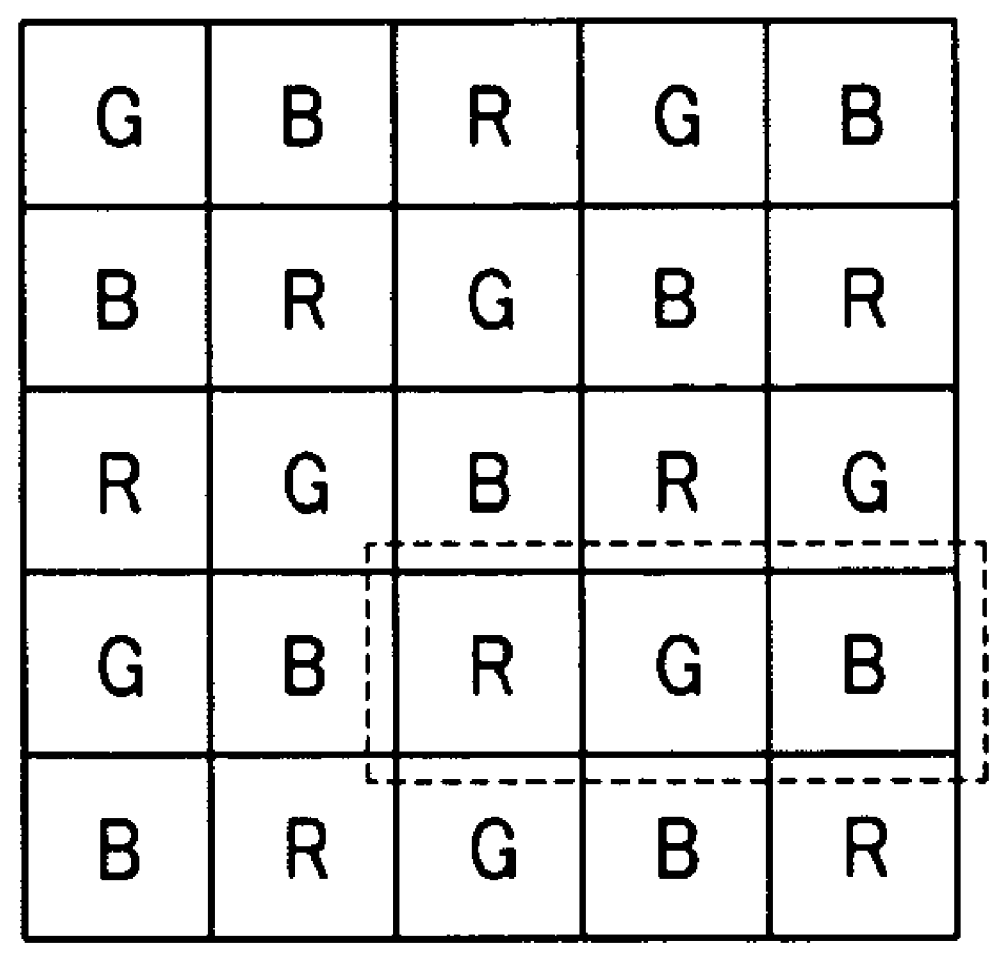
Figure 3:
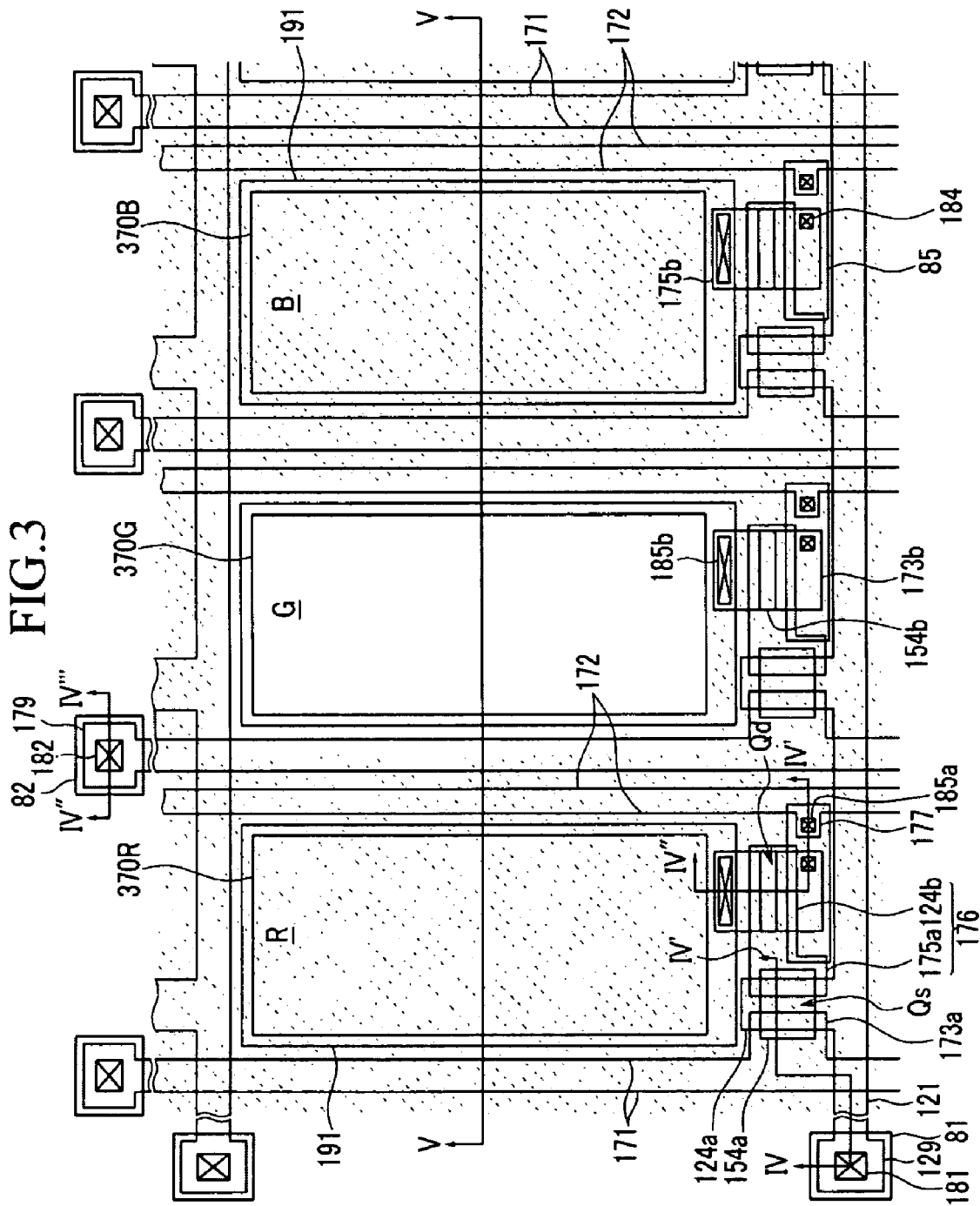
FIG. 3 is a layout view showing three neighboring pixels in the organic light emitting device shown in FIG. 2.
Figure 4:
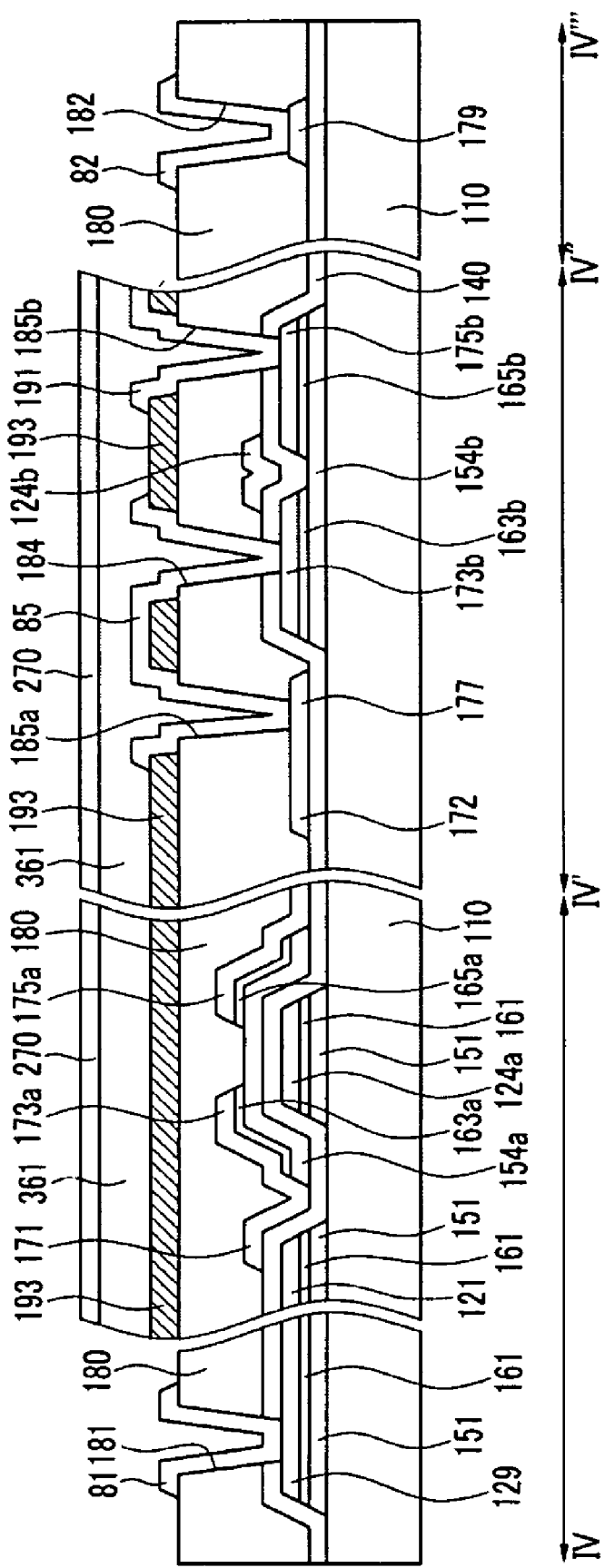
FIG. 4 and FIG. 5 are respectively cross-sectional views of the organic light emitting device according to the exemplary embodiment shown in FIG. 3 taken along the lines IV-IV'-IV''-IV''' and V-V, respectively.
Figure 5:
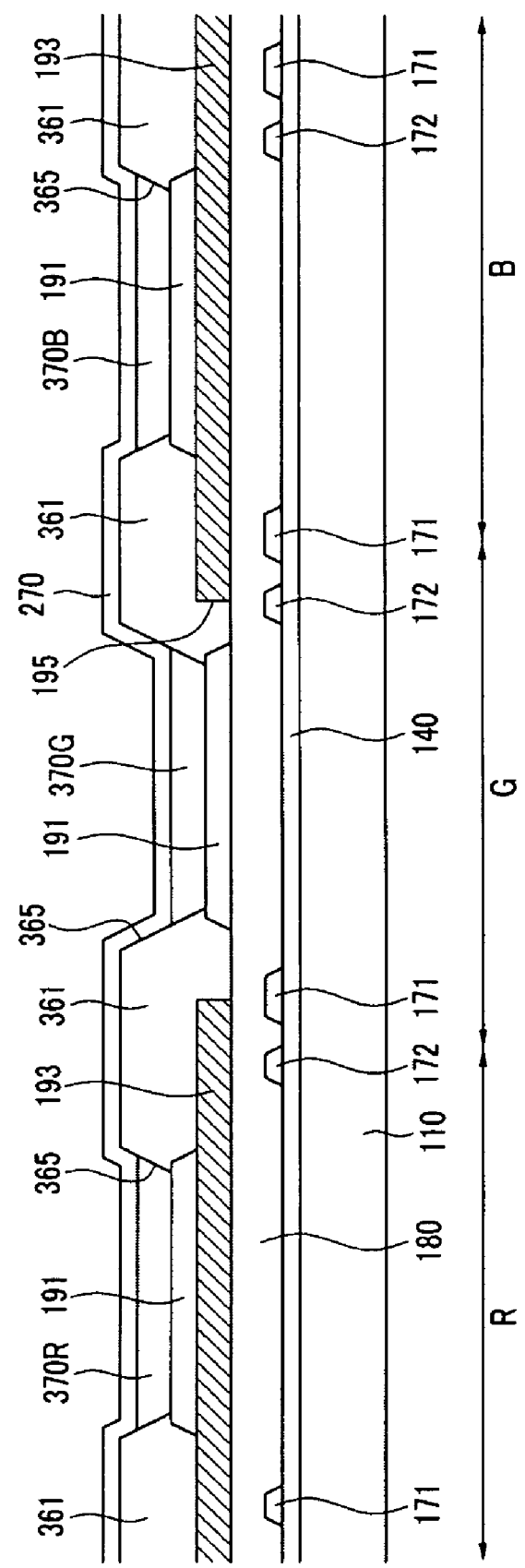

FIG. 2 is a schematic diagram showing an arrangement of a plurality of pixels in the organic light emitting device according to an exemplary embodiment of the present invention, FIG. 3 is a layout view showing three neighboring pixels in the organic light emitting device shown in FIG. 2, and FIG. 4 and FIG. 5 are cross-sectional views of the organic light emitting device according to the exemplary embodiment shown in FIG. 3 taken along the lines IV-IV'-IV''-IV''' and V-V, respectively.

Referring to FIG. 2, the organic light emitting device according to an exemplary embodiment of the present invention includes red pixels R to display a red color, green pixels G to display a green color, and blue pixels B to display a blue color. The red, green, and blue pixels are sequentially and alternately disposed. Three pixels, including a red pixel R, a green pixel G, and a blue pixel B, form one group, and may be repeatedly arranged according to rows and/or columns. However, the pixels may have various arrangements and shapes.

Next, the detailed structure of the organic light emitting device of FIG. 2 will be described with reference to FIG. 3, FIG. 4, and FIG. 5.

FIG. 3 shows one pixel group, which is indicated by the dotted line of FIG. 2 and includes a red pixel R, a green pixel G, and a blue pixel B. Each of the three pixels R, G, and B have the same structure and include a gate line 121, a data line 171, a driving voltage line 172, a switching thin film transistor Qs, and a driving thin film transistor Qd.

A plurality of driving semiconductors 154b and a plurality of semiconductor stripes 151 are disposed on an insulating substrate 110.

The driving semiconductors 154b may have island shapes, and the semiconductor stripes 151 extend in the transverse direction. The driving semiconductors 154b and the semiconductor stripes 151 may be made of a semiconductor material, such as crystalline silicon or amorphous silicon.

A plurality of gate lines 121, a plurality of driving input electrodes 173b, and a plurality of driving output electrodes 175b are disposed on the driving semiconductors 154b and the semiconductor stripes 151.

The gate lines 121 transmit gate signals and extend substantially in the horizontal direction. Each gate line 121 includes a plurality of switching control electrodes 124a projecting upward from the gate line 121, and an end portion 129 having a large area for contact with another layer or an external driving circuit. The gate lines 121 may have substantially the same planer shape as the semiconductor stripes 151.

The driving input electrodes 173b and the driving output electrodes 175b respectively may have island shapes and are spaced from the gate lines 121. The driving input electrodes 173b and the driving output electrodes 175b are opposite to each other on the driving semiconductors 154b.

A plurality of pairs of ohmic contacts 163b and 165b are disposed between the driving semiconductors 154b and the driving input electrodes 173b, and the semiconductor islands 154b and the driving output electrodes 175b, respectively. Also, a plurality of impurity doping portions 161 are disposed between the gate lines 121 and the semiconductor stripes 151.

The ohmic contacts 163b and 165b and the impurity doping portions 161 may be made of a crystalline semiconductor or polysilicon material doped with an impurity, a microcrystalline silicon heavily doped with an n-type impurity such as phosphorous, or an amorphous semiconductor material.

A gate insulating layer 140 is disposed on the gate lines 121, the driving input electrodes 173b, and the driving output electrodes 175b.

A plurality of switching semiconductors 154a, which may be made of hydrogenated amorphous silicon, is disposed on the gate insulating layer 140. The switching semiconductors 154a may have island shapes and overlap with the switching control electrodes 124a.

A plurality of the data lines 171, a plurality of the driving voltage lines 172, and a plurality of electrode members 176 are disposed on the switching semiconductors 154a and the gate insulating layer 140.

The data lines 171 to transmit data signals extend substantially in the longitudinal direction and cross the gate lines 121. Each data line 171 includes a plurality of switching input electrodes 173a that extend toward the switching control electrodes 124a and an end portion 179 having a large area for contact with another layer or an external driving circuit.

The driving voltage lines 172 to transmit driving voltages extend substantially in the longitudinal directional, cross the gate lines 121, and are parallel to the data lines 171. Each driving voltage line 172 includes a plurality of protrusions 177.

The electrode members 176 may have island shapes and are spaced apart from the data lines 171 and the driving voltage lines 172. The electrode members 176 each include one portion 175a (hereinafter referred to as a "switching output electrode") opposite to the switching input electrodes 173a, and other portions 124b (hereinafter referred to as a "driving control electrode") overlapping with the driving semiconductors 154b. The switching input electrodes 173a and the switching output electrodes 175a are opposite each other on the switching semiconductors 154a.

A plurality of pairs of ohmic contacts 163a and 165a are disposed between the switching semiconductors 154a and the switching input electrodes 173a, and the switching semiconductors 154a and the switching output electrode 175a, respectively.

A passivation layer 180 is disposed on the data lines 171, the driving voltage lines 172, and the electrode members 176.

The passivation layer 180 has a plurality of contact holes 185a and 182 exposing the protrusions 177 of the driving voltage lines 172 and the end portions 179 of the data lines 171, respectively, and the passivation layer 180 and the gate insulating layer 140 have a plurality of contact holes 181, 184, and 185b exposing the end portions 129 of the gate lines 121, the driving input electrodes 173b, and the driving output electrodes 175b, respectively.

A translucent member 193 is disposed on the passivation layer 180. The translucent member 193 is disposed on the whole surface of the substrate except in the green pixel G.

The translucent member 193 has characteristics such that a portion of light is transmitted and a portion of light is reflected, and uses distributed Bragg reflection (DBR) to control the reflection ratio of the specific wavelength. This will be described in detail below.

A plurality of pixel electrodes 191, a plurality of connecting members 85, and a plurality of contact assistants 81 and 82 are disposed on the translucent member 193.

The pixel electrodes 191 are connected to the driving output electrodes 175b through the contact holes 185b.

The connecting members 85 are connected to the protrusions 177 of the driving voltage lines 172 and the driving input electrodes 173b through the contact holes 185a and 184, respectively, and form storage capacitors Cst by overlapping with portions of the driving control electrodes 124b.

The contact assistants 81 and 82 are connected to the end portions 129 of the gate lines 121 and the end portions 179 of the data lines 171 through the contact holes 181 and 182, respectively.

The pixel electrodes 191, the connecting members 85, and the contact assistants 81 and 82 may be made of a transparent conductor, such as ITO or IZO.

An insulating bank 361 is disposed on the pixel electrodes 191, the connecting members 85, and the contact assistants 81 and 82. The bank 361 surrounds the edges of the pixel electrodes 191 to define openings 365.

A plurality of organic light emitting members is disposed on the bank 361 and the pixel electrodes 191.

The organic light emitting members may include an auxiliary layer (not shown) to improve light emitting efficiency, as well as light emission layers 370R, 370G, and 370B to emit light. In addition, the auxiliary layer may include one or more of an electron transport layer (not shown), a hole transport layer (not shown), an electron injecting layer (not shown), and a hole injecting layer (not shown).

A common electrode 270 is disposed on the organic light emitting members. The common electrode 270 may be made of a material with a high reflection rate. The common electrode 270 is disposed on the whole surface of the substrate 110, pairs with each pixel electrode 191 to transmit the current to the organic light emitting members.

The pixel electrodes 191, the light emission layers 370R, 370G, and 370B, and the common electrode 270 form organic light emitting diodes LD, wherein the pixel electrodes 191 are anodes and the common electrode 270 is a cathode, or wherein the pixel electrodes 191 are cathodes and the common electrode 270 is an anode.

The translucent member 193 will be described below.

In an exemplary embodiment of the present invention, the translucent member 193 and the common electrode 270 generate a micro-cavity effect. The micro-cavity effect occurs when light is repeatedly reflected between a reflection layer and translucent layers, which are spaced apart from each other by a specific distance (hereinafter, "micro-cavity length") such that light of a specific wavelength is enhanced by constructive interference. Here, the common electrode 270 functions as the reflection layer, and the translucent member 193 functions as the translucent layers.

The common electrode 270 changes the light emitting characteristics of the light from the light emission layers 370R and 370B, and light near a wavelength corresponding to each resonance wavelength among the changed light is enhanced through the translucent member 193 while light of different wavelengths is suppressed. Here, the enhancement and the suppression of the specific wavelengths are determined by the micro-cavity length, and the micro-cavity length may be controlled by the thickness of the translucent member 193.

The translucent member 193 uses DBR, and includes a plurality of layers that are alternately deposited and may be made of inorganic materials having different refractive indexes. When the translucent member 193 is made of inorganic materials and includes a plurality of layers, light loss may be reduced as compared with translucent member 193 made of a metal material.

This translucent member 193 will be explained with reference to FIG. 7.

Figure 7:
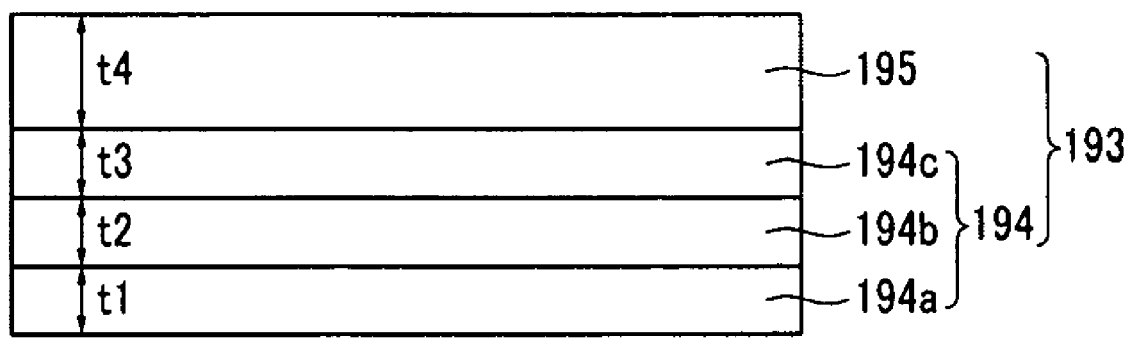
FIG. 7 is a schematic diagram showing a translucent member according to an exemplary embodiment of the present invention.

FIG. 7 is a schematic diagram of the translucent member according to an exemplary embodiment of the present invention.

Referring to FIG. 7, the translucent member 193 includes a lower layer 194 and an upper layer 195, and the lower layer 194 includes a first lower layer 194a, a second lower layer 194b, and a third lower layer 194c. The thickness of the lower layer 194 is fixed for a specific wavelength in both the red and blue pixels, and the thickness of the upper layer 195 is controlled to satisfy the constructive interference conditions according to the wavelength of each pixel by considering the micro-cavity length.

The first lower layer 194a and the third lower layer 194c may be made of the same material having a first refractive index, and the second lower layer 194b and the upper layer 195 may be made of the same material having a second refractive index. That is to say, the translucent member 193 may have a deposition structure such that the layers made of inorganic materials having different refractive indexes are alternately deposited. For example, the first lower layer 194a and the third lower layer 194c may be made of silicon nitride ($SiN_x$) having a refractive index of about 1.8, and the second lower layer 194b and the upper layer 195 may be made of silicon oxide ($SiO_x$) having a refractive index of about 1.5.

Here, the thicknesses $t_1$, $t_2$, and $t_3$ of the first lower layer 194a, the second lower layer 194b, and the third lower layer 194c may each be ¼ of the thickness of the wavelength of the corresponding red or blue region. For example, the thicknesses $t_1$, $t_2$, and $t_3$ for the blue region may be determined using Equations (1) and (2) as follows.

$$\text{thickness } t_1 \text{ and } t_3 = \lambda 4/n_1 \quad (1)$$

$$\text{thickness } t_2 = \lambda/4n_2 \quad (2)$$

Here, $n_1$ is the refractive index of the $SiN_x$, $n_2$ is the refractive index of the $SiO_x$, and $\lambda$ is the wavelength of the blue region.

When the wavelength of the blue region is 465 nm, the thicknesses $t_1$ and $t_3$ of the first lower layer 194a and the third lower layer 194c, and the thickness $t_2$ of the second lower layer 194b, are 64 nm and 76 nm, respectively.

On the other hand, the thickness $t_4$ of the upper layer 195 is determined in consideration of the micro-cavity length.

The micro-cavity length is the length from the common electrode 270 to the translucent member 193, that is, the sum of the thicknesses of the applicable light emission member and the pixel electrode 191. Here, because the thicknesses of the applicable light emission member and the pixel electrode 191 are fixed, and the thickness of the lower layer 194 of the translucent member 193 is fixed as above-described, the micro-cavity length may be determined by the thickness of the upper layer 195.

The micro-cavity length L satisfies the constructive interference conditions for each wavelength according to the red and blue pixels, and may be the same length in each of the red and blue pixels, while simultaneously satisfying the constructive interference conditions in the red pixel and the blue pixel in an exemplary embodiment of the present invention. In this case, a process of forming translucent members 193 having different thicknesses $t_1$, $t_2$, $t_3$, and $t_4$ to form different micro-cavity lengths for each pixel R, G, and B may be omitted.

The micro-cavity length simultaneously satisfies the constructive interference conditions in the red pixel and the blue pixel and may be represented as Equation 3.

$$L = m_1\lambda_1/2 = m_2\lambda_2/2 \quad (3)$$

Here, $m_1$ and $m_2$ are natural numbers, $\lambda_1$ is the wavelength of the red region, and $\lambda_2$ is the wavelength of the blue region.

On the other hand, the micro-cavity length in an exemplary embodiment of the present invention may be the lowest value among values that satisfy the constructive interference conditions. For example, when the peak wavelength of the blue region is 465 nm and the peak wavelength of the red region is 610 nm, the micro-cavity length L is smallest at $m_1 \approx 2$ and $m_2 \approx 3$.

Now, the thickness $t_4$ of the upper layer 195 will be described in detail with reference to FIGS. 8A and 8B.

Figure 8A:
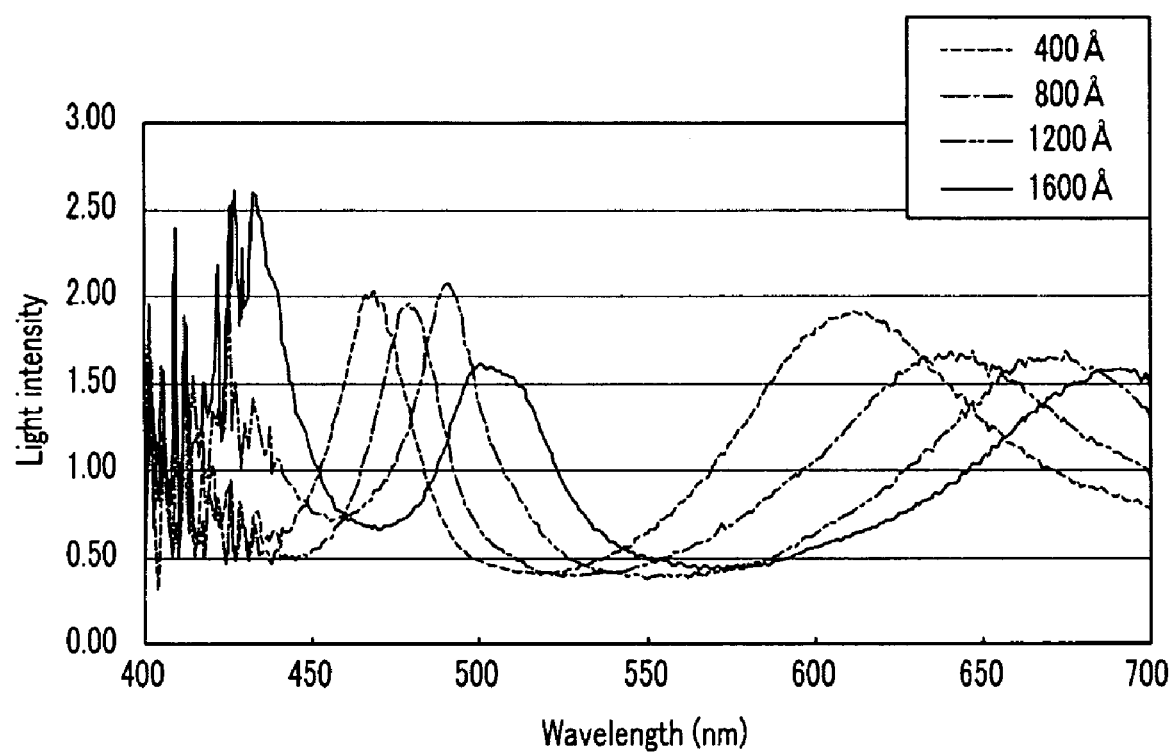
FIG. 8A and FIG. 8B are graphs showing light intensity with respect to wavelength according to various exemplary embodiment having various thickness of the upper layer.
Figure 8B:
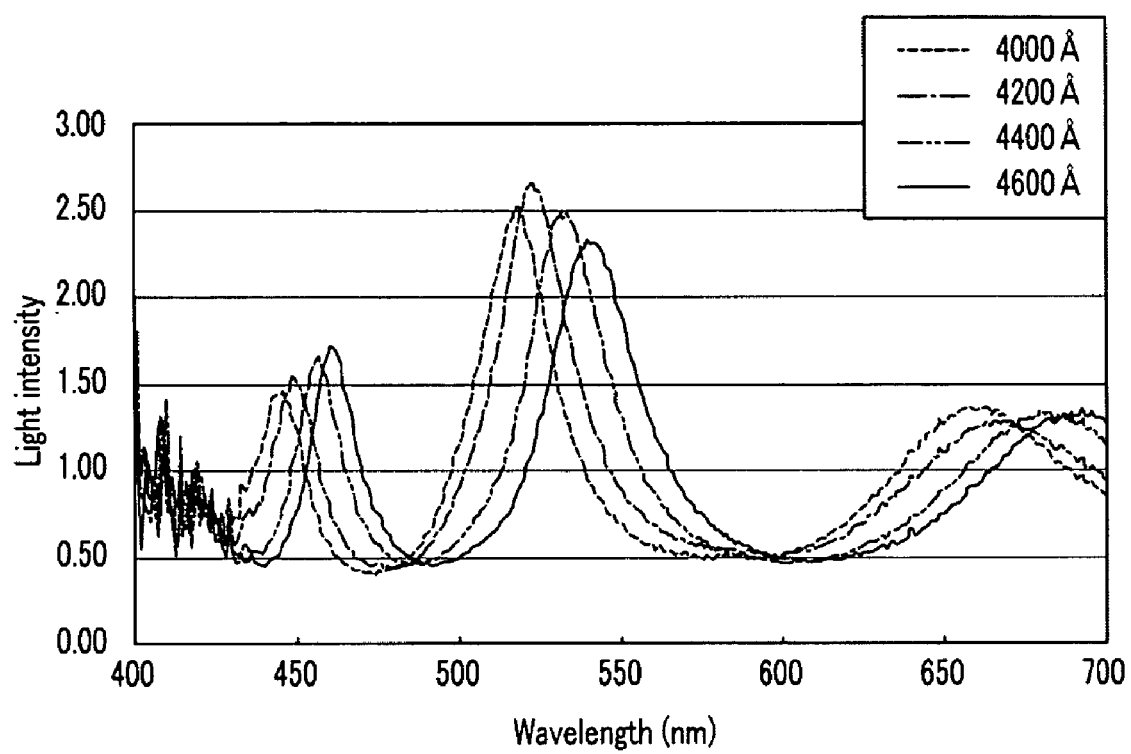

FIGS. 8A and 8B are graphs showing light intensity with respect to wavelength according to various exemplary embodiments having various thicknesses of the upper layer.

Referring to FIGS. 8A and 8B, the thickness $t_4$ of the upper layer 195 may be 400 Å when the light intensity is highest in 465 nm, which is the peak wavelength of the blue region and 610 nm, which is the peak wavelength of the red region. When the translucent member 193 includes a plurality of layers of inorganic materials, a color shift that causes a color to look different at the front side and the lateral side may be prevented.

A color shift, in which the color looks different because the peak wavelength of the emitting light spectrum in the front side is shortened or lengthened, for example, by more than 40 nm, in the lateral side, is generated in the emitting light of the blue region and the emitting light of the green region, which pass through the translucent member 193 and are overlapped into one spectrum.

As above-described, the peak wavelength of the emitting light spectrum, in which peak wavelengths representing two colors are overlapped, is determined according to the micro-cavity length L, and concretely, the peak wavelength moves into the blue region when the micro-cavity length is decreased and the peak wavelength moves into the green region when the micro-cavity length is increased.

Accordingly, the micro-cavity effects produced using the translucent member 193 are used in an exemplary embodiment of the present invention, and the micro-cavity length may be minimized so that the peak wavelengths of the overlapped emitting light spectrum appear in the blue region.

On the other hand, when the micro-cavity length is small, the peak wavelength appears little in the green region. Accordingly, the translucent member 193 is not disposed in the green pixel G in order to prevent the micro-cavity effects. The green light emitted through the light emission layer 370G in the green pixel G is passed through the substrate 110 unchanged.

In this way, when the translucent member 193, which includes the upper layer 195, which may have a thickness of 400 Å, is disposed in the blue pixel B and the red pixel R such that the micro-cavity length L is minimized, and the translucent member 193 is not disposed in the green pixel G, the color shift can be confirmed as in FIG. 8A and FIG. 8B.

Figure 9A:
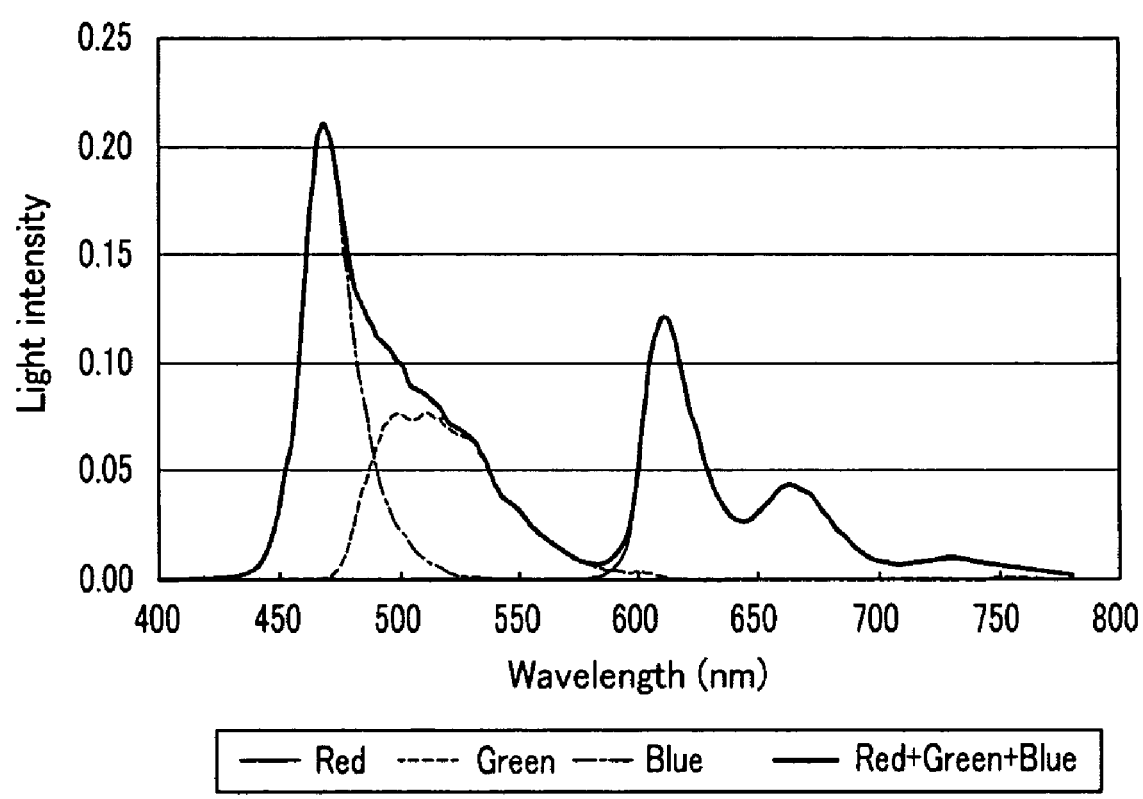
FIG. 9A and FIG. 9B are graphs showing light spectrums at the front side and the lateral side of the organic light emitting device according to the present exemplary embodiment.
Figure 9B:
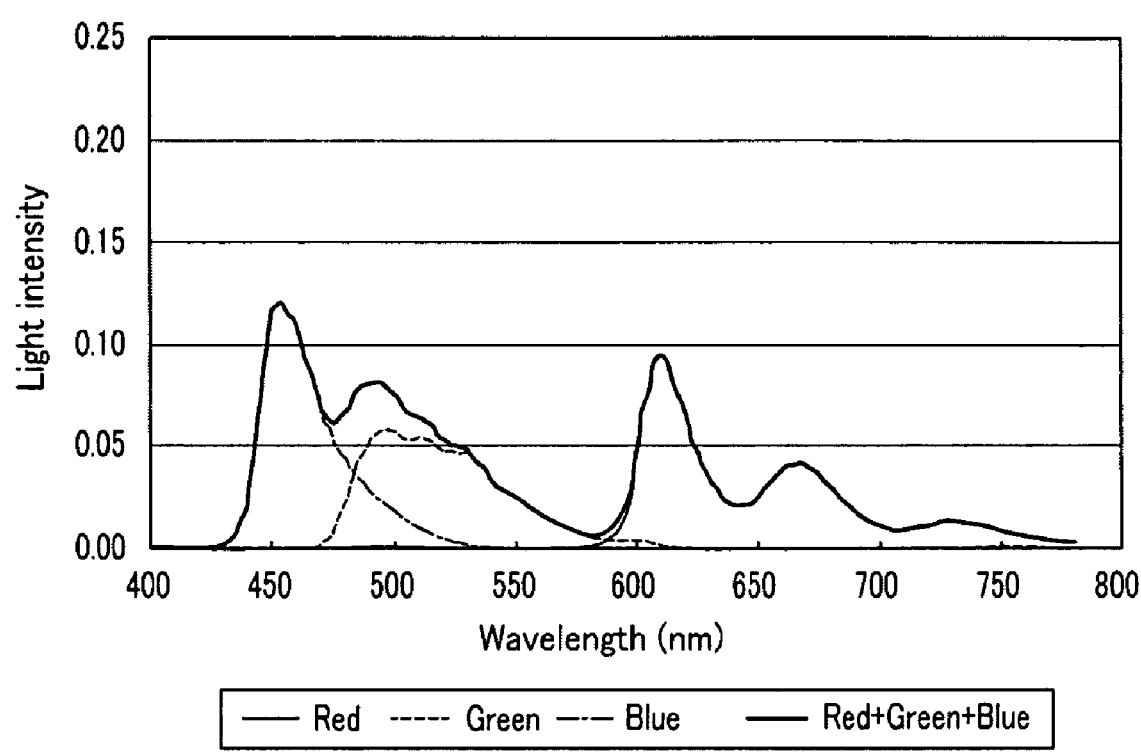

FIG. 9A and FIG. 9B are graphs showing light spectrums at the front side and the lateral side of the organic light emitting device, respectively, according to the present exemplary embodiment.

The moving degree of the peak wavelengths of the red region (about 610 nm), the green region (about 530 nm), and the blue region (about 465 nm) can be confirmed through the color shift at the front side and the lateral side, and as shown in the graphs, the peak wavelength ranges of the red region, the green region, and the blue region in the front side, and the peak wavelength ranges of the red region, the green region, and the blue region in the lateral side, are nearly the same. Accordingly, the color shift may be minimized in the organic light emitting device according to an exemplary embodiment of the present invention.

A translucent member 193 including four layers is explained in the present exemplary embodiment, but the translucent member 193 may include N layers in which two types of layers having different refractive indexes are alternately deposited. Here, all of the layers of the translucent member 173 except the top ($N^{th}$) layer may be the same as the above-described lower layer 194, and the top layer may be the same as the above-described upper layer 195.

In the present exemplary embodiment, one switching thin film transistor Qs and one driving thin film transistor Qd 1 are described, but at least one thin film transistor and a plurality of signal lines may also be included.

Also, the structure of the thin film transistor is not limited to the above-described structure, and may instead be a bottom gate type, a top gate type, etc.

Further, a bottom emission type display device in which light emitted from the emission layer is transmitted toward the substrate 110 is described in the present exemplary embodiment. However, a top emission type display device in which the light emitted from the emission layer is transmitted toward the common electrode 270 may alternatively be adapted. In this case, the pixel electrode 191 may be made of an opaque conductor, and the common electrode 270 may be made of a transparent conductor. Also, the translucent member 193 may be disposed under the common electrode 270 to generate the micro-cavity effect along with the pixel electrode 191.

Now, an organic light emitting device according to another exemplary embodiment of the present invention will be described in detail with reference to FIG. 6, as well as to FIG. 1, FIG. 2, and FIG. 3.

Figure 6:
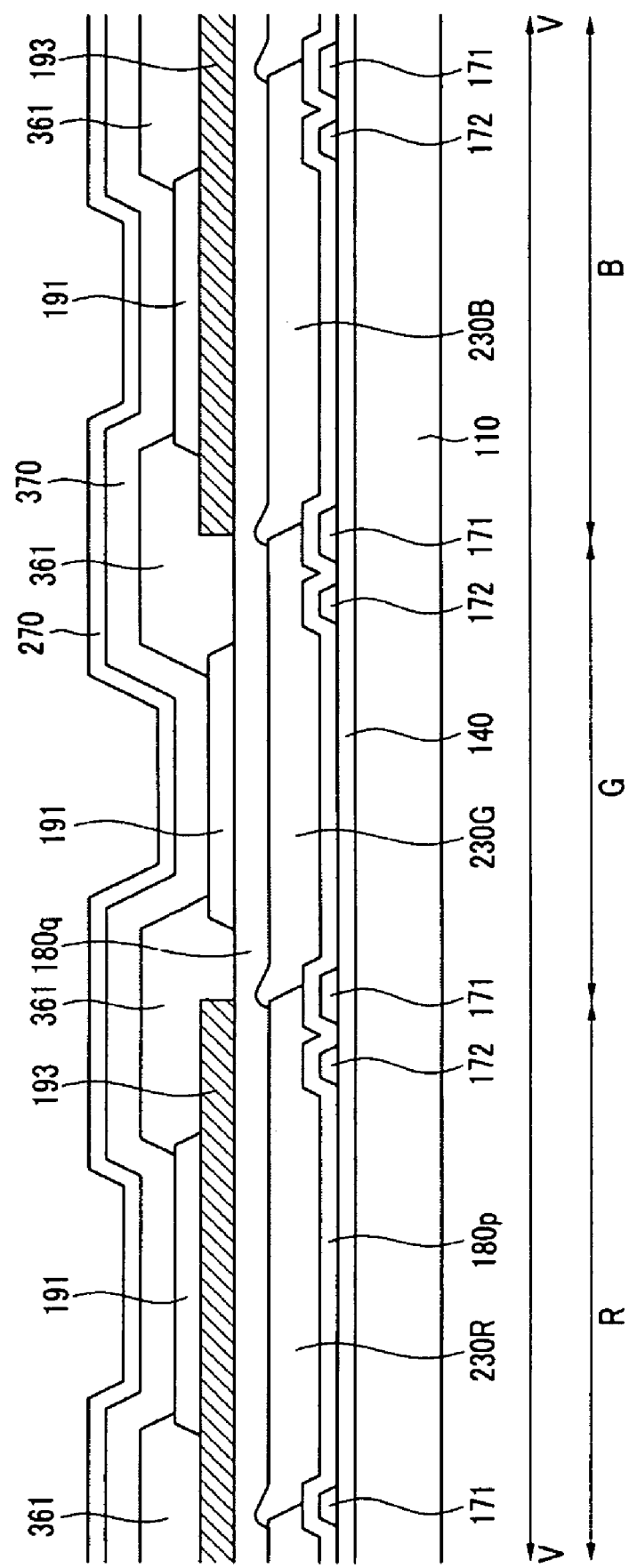
FIG. 6 is a cross-sectional view of the organic light emitting device according to another exemplary embodiment shown in FIG. 3 taken along the line V-V.

FIG. 6 is a cross-sectional view of the organic light emitting device shown in FIG. 3 taken along line V-V according to another exemplary embodiment of the present invention.

In an organic light emitting device according to the present exemplary embodiment, gate lines 121, data lines 171, driving voltage lines 172, switching thin film transistors Qs, driving thin film transistors Qd, a gate insulating layer 140, pixel electrodes 191, and a common electrode 270 are also disposed on a substrate 110, like in the above-described exemplary embodiment.

Like the above-described exemplary embodiment, a translucent member 193 also uses DBR and includes a plurality of layers that may be made of inorganic materials having different refractive indexes and are alternately deposited as in FIG. 7.

That is to say, the translucent member 193 includes a lower layer 194 and an upper layer 195, and the lower layer 194 includes a first lower layer 194a, a second lower layer 194b, and a third lower layer 194c.

The first lower layer 194a and the third lower layer 194c may be made of the first material having the first refractive index, that is, $SiN_x$ having a refractive index of about 1.8, and the second lower layer 194b and upper layer 195 may be made of the second material having the second refractive index, that is, $SiO_x$ having a refractive index of about 1.5.

Each of the thicknesses $t_1$, $t_2$, and $t_3$ of the first lower layer 194a, the second lower layer 194b, and the third lower layer 194c may be ¼ of the thickness of the wavelength of the corresponding red or blue region. For example, the thickness of the wavelength of the blue region may be determined using Equations (1) and (2) as follows.

$$\text{thickness } t_1 \text{ and } t_3 = \lambda/4n_1 \quad (1)$$

$$\text{thickness } t_2 = \lambda/4n_2 \quad (2)$$

Here, $n_1$ is the refractive index of the $SiN_x$, $n_2$ is the refractive index of the $SiO_x$, and $\lambda$ is the wavelength of the blue region.

The thickness $t_4$ of the upper layer 195 may be determined in consideration of the micro-cavity length L.

The micro-cavity length L satisfies the constructive interference conditions for the wavelength corresponding to the red and blue pixels, may be the same length in the red and blue pixels, and may simultaneously satisfy the constructive interference conditions in the red pixel and blue pixel in an exemplary embodiment of the present invention.

The micro-cavity length L simultaneously satisfying the constructive interference condition in the red pixel and blue pixel may be represented as in Equation 3.

$$L = m_1\lambda_1/2 = m_2\lambda_2/2 \quad (3)$$

Here, $m_1$ and $m_2$ are natural numbers, $\lambda_1$ is the wavelength of the red region, and $\lambda_2$ is the wavelength of the blue region.

The micro-cavity length L in an exemplary embodiment of the present invention may the lowest value among the values that satisfy the constructive interference conditions in an exemplary embodiment of the present invention. For example, when the peak wavelength of the blue region is 465 nm and the peak wavelength of the red region is 610 nm, the micro-cavity length L is smallest at $m_1 \approx 2$ and $m_2 \approx 3$. Here, the thickness $t_4$ of the upper layer 195 may be 400 Å.

The translucent member 193 is not present in the green pixel G.

That is to say, like the previous described exemplary embodiment, the translucent member 193 including the upper layer 195 with a thickness of 400 Å in the red pixel R and the blue pixel B may be used to minimize the micro-cavity length L, and the translucent member 193 is absent in the green pixel G.

The present exemplary embodiment includes color filters 230R, 230G, and 230B in each pixel, and the color filters 230R, 230G, and 230B may be a color filter on array (COA)

type, unlike the previous exemplary embodiment. A lower organic layer 180p and an upper organic layer 180q are respectively disposed on/under the color filters 230R, 230G, and 230B.

When the color filters 230R, 230G, and 230B are used to display the color of each pixel, an emission layer 370 emitting a white color is disposed on the whole surface of the substrate, replacing the light emission layers 370R, 370G, and 370B disposed in each pixel R, G, and B of the previous exemplary embodiment.

The emission layer 370 may include a plurality of sequentially deposited sub-emission layers of materials emitting red, green, and blue light, and may emit white light by combining their wavelengths of light. Herein, exemplary embodiments of the present invention are not limited to vertically forming the sub-emission layers, as the sub-emission layers may be horizontally formed. Also, the combination of light to emit the white light is not limited to red, green, and blue color light. The sub-emission layers may include various color combinations that emit the white light.

The white light emitted from the emission layer 370 forms micro-cavity effects between the common electrode 270 and the translucent member 193 in the red pixel and the blue pixel to emit changed light, and the changed light is transmitted through the color filters 230R and 230B such that red and blue colors are displayed. White light emitted from the emission layer 370 is transmitted through the color filter 230G so that the green color is displayed in the green pixel.

Figure 10A:
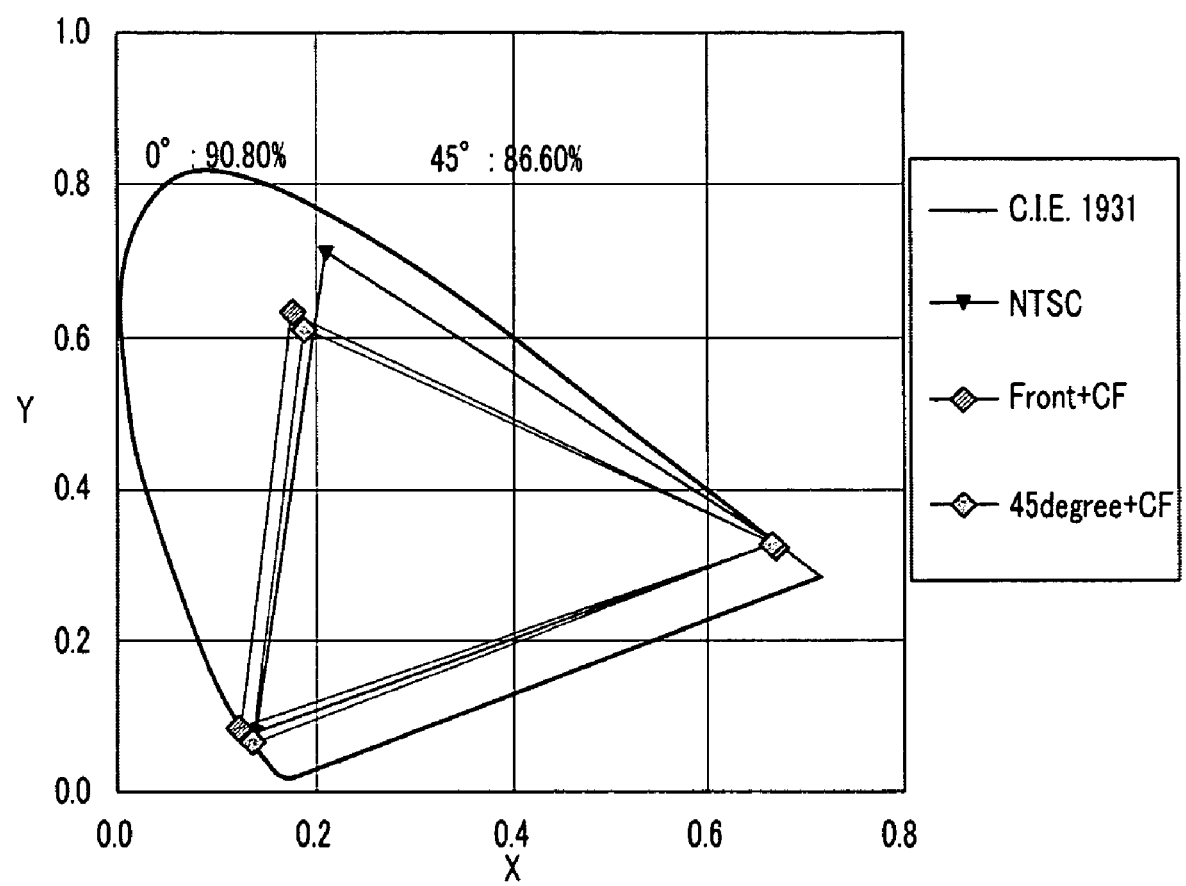
FIG. 10A and FIG. 10B are graphs of the CIE 1931 color coordinate and the CIE 1976 color coordinate showing color reproducibility of the organic light emitting device according to another exemplary embodiment of the present invention.
Figure 10B:
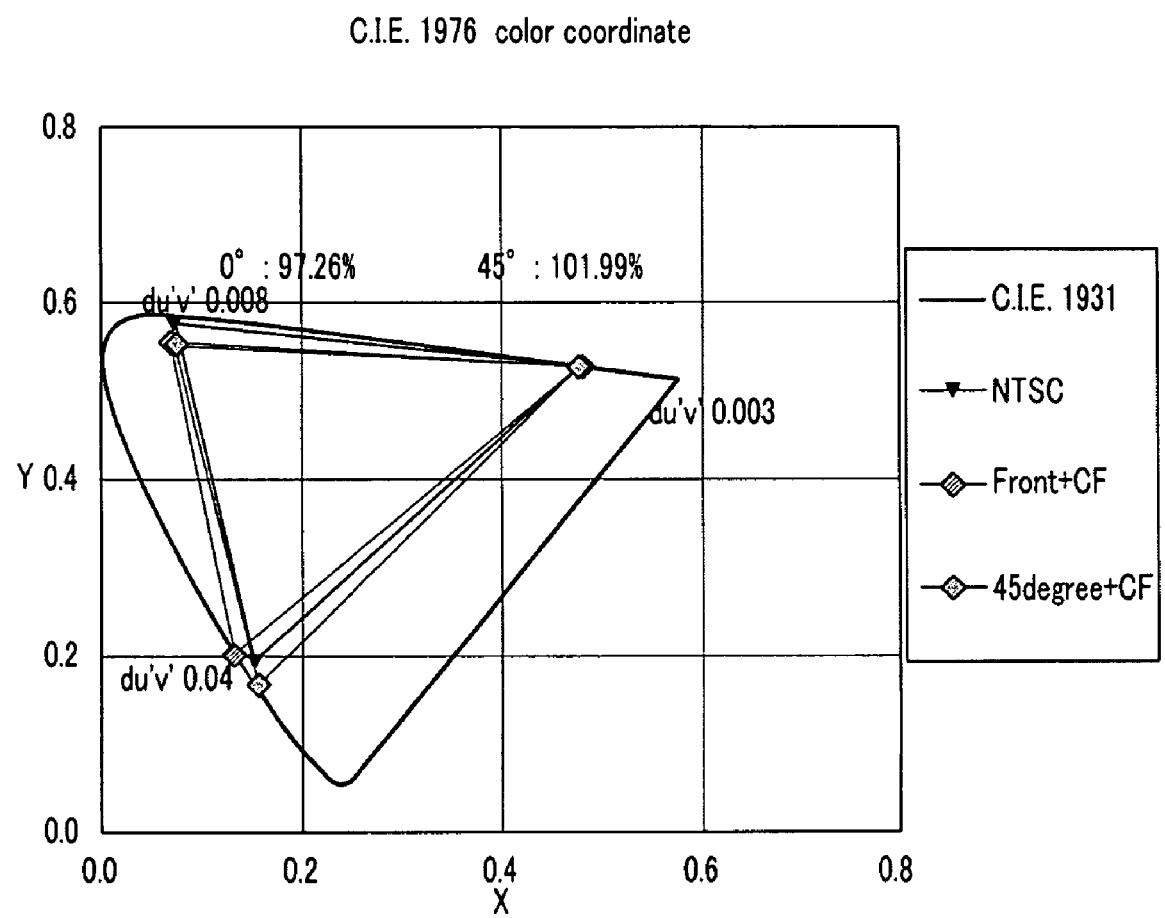

FIG. 10A and FIG. 10B show color reproducibility when using the white emission layer and color filter.

FIG. 10A and FIG. 10B are graphs of the CIE 1931 color space and the CIE 1976 color space showing the color reproducibility of the organic light emitting device according to another exemplary embodiment of the present invention.

As shown in FIG. 10A, as a result of observing the color reproducibility by using the translucent member, the white light, and the color filter CF in the case of the CIE 1931 color space, color reproducibility of about 90.80% can be obtained as compared with NTSC in the front side, and color reproducibility of about 86.60% can be obtained in the lateral side. Accordingly, when using the translucent member, the change in color reproducibility is remarkably improved in the front and lateral sides compared with a conventional case in which the color reproducibility is reduced by about 30-40%.

Likewise, as shown in FIG. 10B, in the case of the CIE 1976 color space, color reproducibility of about 97.26% can be obtained and color reproducibility of about 101.99% can be obtained compared with NTSC, and accordingly the color reproducibility may be remarkably improved.

Also, the degrees du'v', which are represented as numbers, of the color shift of the red region, the green region, and the blue region are respectively 0.003, 0.008, and 0.04, as shown in FIG. 10B. Accordingly, color shift may be remarkably reduced as compared to the conventional translucent member in which the degree of color shift is about 0.07 to 0.09.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising a first pixel, a second pixel, and a third pixel to display different colors from each other,
   wherein the organic light emitting device comprises:
   a first electrode;
   a second electrode facing the first electrode;
   a light emitting member disposed between the first electrode and the second electrode; and
   a translucent member disposed on or under the first electrode and forming a micro-cavity along with the second electrode, wherein the translucent member has the same thickness in the first pixel as in the second pixel,
   wherein the translucent member is disposed corresponding to the first pixel and the second pixel, and the translucent member is not disposed corresponding to the third pixel, and
   wherein the first pixel, the second pixel, and the third pixel are a red pixel, a blue pixel, and a green pixel, respectively.

2. The organic light emitting device of claim 1, wherein the micro-cavity length is the smallest value among values simultaneously satisfying $L = m_1\lambda_1/2$ and $L = m_2\lambda_2/2$, where $\lambda_1$ is a wavelength of the red region, $\lambda_2$ is a wavelength of the blue region, and $m_1$ and $m_2$ are natural numbers, the micro cavity length L being a length from the second electrode to the translucent member.

3. The organic light emitting device of claim 2, wherein the translucent member includes N layers, wherein the layers comprise a first layer and a second layer that are alternately disposed and have different refractive indexes, and
   the thicknesses of the first layer and the second layer, except for the $N^{th}$ layer, are $\lambda/4n_1$ and $\lambda/4n_2$, where $n_1$ is a refractive index of the first layer, $n_2$ is a refractive index of the second layer, and $\lambda$ is a wavelength of the blue region.

4. The organic light emitting device of claim 3, wherein the thickness of the $N^{th}$ layer is 400 Å.

5. The organic light emitting device of claim 1, wherein the first pixel, the second pixel, and the third pixel further comprise a red color filter, a blue color filter, and a green color filter, respectively.

6. The organic light emitting device of claim 5, wherein the light emitting member comprises a plurality of sub-emission layers to emit light of different wavelengths, and
   a white light is emitted by combining the light of the different wavelengths.

7. An organic light emitting device comprising a red pixel, a green pixel, and a blue pixel,
   wherein the organic light emitting device comprises:
   a first electrode;
   a light emitting member to emit white light disposed on the first electrode;
   a second electrode disposed on the light emitting member;
   a color filter disposed on or under the first electrode; and
   a translucent member comprising a first layer and a second layer that are alternately disposed and have different refractive indexes, the translucent member being disposed between the light emitting member and the color filter,
   wherein the translucent member is disposed corresponding to the red pixel and the blue pixel, and the translucent member is not disposed corresponding to the green pixel.

8. The organic light emitting device of claim 7, wherein the second electrode and the translucent member form a micro-cavity.

9. The organic light emitting device of claim 8, wherein the translucent member has the same thickness in the red pixel as in the blue pixel.

10. The organic light emitting device of claim 8, wherein the micro-cavity length is a smallest value among values simultaneously satisfying $L = m_1\lambda_1/2$ and $L = m_2\lambda_2/2$, where $\lambda_1$ is a wavelength of the red region, $\lambda_2$ is a wavelength of the blue region, and $m_1$ and $m_2$ are natural numbers, the micro cavity length L being the length from the second electrode to the translucent member.

11. The organic light emitting device of claim 10, wherein the translucent member includes N layers, and the thickness of one layer among the N layers is 400 Å.

12. An organic light emitting device comprising a first pixel, a second pixel, and a third pixel to display different colors from each other, wherein the organic light emitting device comprises:

a first electrode and a second electrode facing each other;

a light emitting member to emit white light disposed between the first electrode and the second electrode;

a color filter disposed on or under the light emitting member; and a translucent member disposed between the light emitting member and the color filter, wherein the white light is changed when reflected between the second electrode and the translucent member in the first pixel and the second pixel, the changed light is transmitted through the color filter to display a first color and a second color, and the white light is transmitted through the color filter to display a third color in the third pixel without transmitting the translucent member, wherein the first color is red, the second color is blue, and the third color is green.

13. The organic light emitting device of claim 12, wherein the translucent member has the same thickness in the first pixel as in the second pixel.

14. The organic light emitting device of claim 13, wherein the micro-cavity length is a smallest value among values simultaneously satisfying $L = m_1\lambda_1/2$ and $L = m_2\lambda_2/2$, where $\lambda_1$ is a wavelength of the red region, $\lambda_2$ is a wavelength of the blue region, and $m_1$ and $m_2$ are natural numbers, the micro cavity length L being a length from the second electrode to the translucent member, and the translucent member includes N layers, wherein the layers are made up of a first layer and a second layer that are alternately disposed and have different refractive indexes, and the thicknesses of the first layer and the second layer, except for the $N^{th}$ layer, are $\lambda/4n_1$ and $\lambda/4n_2$, respectively, where $n_1$ is a refractive index of the first layer, $n_2$ is a refractive index of the second layer, and $\lambda$ is a wavelength of the blue region.

15. The organic light emitting device of claim 14, wherein the thickness of the $N^{th}$ layer is 400 Å.

* * * * *